(12) United States Patent
Kawasoe

(10) Patent No.: US 11,942,928 B2
(45) Date of Patent: Mar. 26, 2024

(54) SEMICONDUCTOR DEVICE, POWER-ON RESET CIRCUIT, AND CONTROL METHOD OF SEMICONDUCTOR DEVICE

(71) Applicant: LAPIS TECHNOLOGY CO., LTD., Kanagawa (JP)

(72) Inventor: Suguru Kawasoe, Kanagawa (JP)

(73) Assignee: LAPIS TECHNOLOGY CO., LTD., Yokohama (JP)

( * ) Notice: Subject to any disclaimer, the term of this patent is extended or adjusted under 35 U.S.C. 154(b) by 0 days.

(21) Appl. No.: 17/955,049

(22) Filed: Sep. 28, 2022

(65) Prior Publication Data

US 2023/0106646 A1  Apr. 6, 2023

(30) Foreign Application Priority Data

Sep. 29, 2021 (JP) ................................. 2021-160059

(51) Int. Cl.
*H03K 17/22* (2006.01)
*G05F 3/26* (2006.01)

(52) U.S. Cl.
CPC ........... *H03K 17/223* (2013.01); *G05F 3/262* (2013.01)

(58) Field of Classification Search
None
See application file for complete search history.

(56) References Cited

U.S. PATENT DOCUMENTS

| 4,812,679 | A | * | 3/1989 | Mahabadi | ............ | H03K 17/223 327/143 |
| 4,885,476 | A | * | 12/1989 | Mahabadi | ............ | H03K 17/223 327/143 |
| 5,534,804 | A | * | 7/1996 | Woo | ...................... | H03K 17/223 327/143 |
| 6,759,852 | B1 | * | 7/2004 | Samad | ................. | H03K 17/223 327/143 |
| 7,482,847 | B2 | * | 1/2009 | Suzuki | ................. | H03K 17/223 327/143 |
| 8,035,426 | B1 | * | 10/2011 | Ecker | ................... | H03K 17/223 327/143 |
| 8,344,767 | B2 | * | 1/2013 | Li | ........................ | H03K 17/223 327/143 |

(Continued)

FOREIGN PATENT DOCUMENTS

JP      2011-086989 A      4/2011

*Primary Examiner* — Jeffery S Zweizig
(74) *Attorney, Agent, or Firm* — Volentine, Whitt & Francos, PLLC

(57) ABSTRACT

A semiconductor device that outputs a reset signal for controlling a reset operation of a reset target circuit connected to a first power supply and a second power supply having a voltage lower than a voltage of the first power supply, the semiconductor device including: a power supply voltage monitoring circuit connected to the first power supply and the second power supply, the power supply voltage monitoring circuit monitors the voltage of the first power supply, wherein the power supply voltage monitoring circuit includes a first transistor having a first conductive type and a second transistor having a second conductive type different from the first conductive type, and wherein the reset signal is switched when the voltage of the first power supply is equal to or greater than a sum of a threshold voltage of the first transistor, and a threshold voltage of the second transistor.

6 Claims, 6 Drawing Sheets

(56) References Cited

U.S. PATENT DOCUMENTS

| | | | |
|---|---|---|---|
| 9,397,654 B2* | 7/2016 | Lou | H03K 17/223 |
| 9,628,080 B2* | 4/2017 | Wang | H03K 19/018521 |
| 10,790,806 B2* | 9/2020 | Shreepathi Bhat | H03K 17/223 |
| 2011/0084740 A1 | 4/2011 | Kawamura | |
| 2014/0218079 A1 | 8/2014 | Kawamura | |

* cited by examiner

PRIOR ART

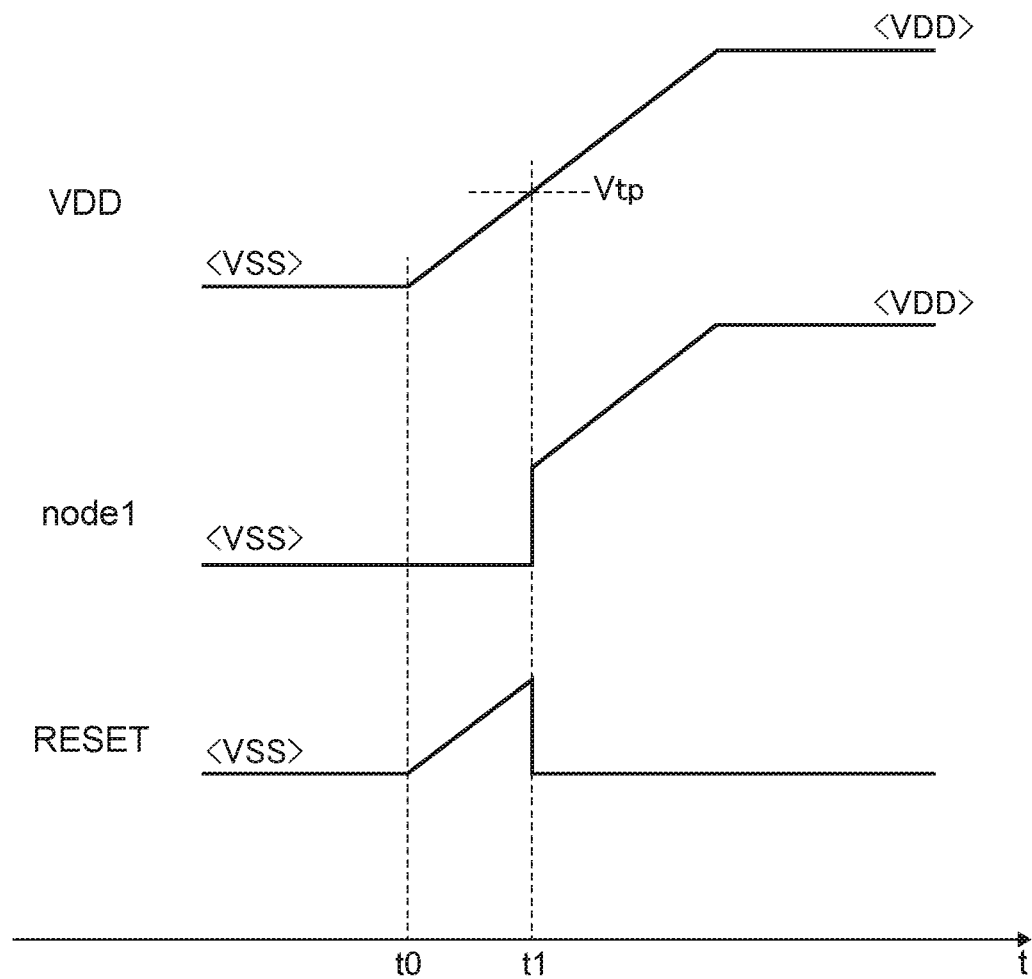

SEMICONDUCTOR DEVICE, POWER-ON RESET CIRCUIT, AND CONTROL METHOD OF SEMICONDUCTOR DEVICE

CROSS-REFERENCE TO RELATED APPLICATION

This application claims priority under 35 USC 119 from Japanese Patent Application No. 2021-160059, filed on Sep. 29, 2021, the disclosure of which is incorporated by reference herein.

BACKGROUND

Technical Field

The present disclosure relates to a semiconductor device, a power-on reset circuit, and a control method of a semiconductor device.

Related Art

A power-on reset circuit is typically used in a semiconductor device. For example, in a semiconductor device including a flip-flop or the like used to configure a register, it is necessary to perform a reset operation when power is turned on. Since the flip-flop or the like has an indefinite initial value, when the flip-flop or the like is operated without performing the reset operation after power is turned on, a malfunction may occur in the semiconductor device. The power-on reset circuit is a circuit for causing the flip-flop or the like to perform the reset operation when power is turned on, and is provided to normally operate the semiconductor device.

For example, Japanese Patent Application Laid-Open (JP-A) No. 2011-086989, discloses a conventional power-on reset function. A power-on reset circuit 50 according to a conventional example disclosed in Japanese Patent Application Laid-Open (JP-A) No. 2011-086989, will be described with reference to FIGS. 5 and 6. As illustrated in FIG. 5, the power-on reset circuit 50 includes an N-type Metal Oxide Semiconductor-Field Effect Transistor (MOS-FET) (hereinafter, "NMOS") N1, a P-type MOS-FET (hereinafter, "PMOS") P1, and an inverter INV. A gate of the NMOS N1 is connected to a bias terminal 15, a drain is connected to a drain of the PMOS P1, and a source is connected to a power supply VSS. A gate of the PMOS P1 is connected to the power supply VSS, a drain is connected to the drain of the NMOS N1, and a source is connected to a power supply VDD. The inverter INV has an input connected to a node node1 that is a connection point between the drain of the NMOS N1 and the drain of the PMOS P1, and an output serving as an output terminal 16 that outputs a reset signal (hereinafter, "RESET"). In the following description, the PMOS and the NMOS are collectively referred to as "MOS transistors".

The bias terminal 15 is connected to a bias circuit (for example, a current mirror circuit (not illustrated)) that generates a bias voltage and is provided separately from the power-on reset circuit 50. That is, the NMOS N1 functions as a current mirror that mirrors a current generated in the bias circuit. Here, mirroring refers to causing a current having a current amount corresponding to a current amount generated in the bias circuit to flow. A power supply of the bias circuit is a system different from the power supply VDD of the power-on reset circuit 50, and rises earlier than the power supply VDD of the power-on reset circuit 50. The PMOS P1 functions as a power supply voltage monitor that monitors a voltage of the power supply VDD. Here, monitoring the voltage of the power supply VDD means operating in accordance with a rise of the voltage of the power supply VDD. The inverter INV functions as an output buffer. The output terminal 16, to which the reset signal RESET generated as an output signal is output, is connected to a circuit (hereinafter, "reset target circuit" (not illustrated)) as a target of the reset operation, and the reset target circuit executes the reset operation when the power supply VDD rises by the reset signal RESET.

An operation of the power-on reset circuit 50 will be described with reference to FIG. 6. FIG. 6 illustrates a time chart associated with the operation of the power-on reset circuit 50. FIG. 6 illustrates changes in waveforms of the power supply VDD, the node node1, and the reset signal RESET along the passage of time t.

A time when the voltage is applied to the power supply VDD of the power-on reset circuit 50 is time t0. In a procedure in which a voltage <VDD> (hereinafter, a potential or a voltage of X(V) is represented by <X>) of the power supply VDD increases from time t0, while the voltage <VDD> is less than a threshold voltage Vtp of the PMOS P1, a gate voltage Vgs of the PMOS P1 is still low, and the PMOS P1 is turned off. Since the NMOS N1 is turned on, a potential of the node node1 is identical to a potential of the power supply VSS. At time t1 when the voltage <VDD> reaches the threshold voltage Vtp of the PMOS P1, the gate voltage Vgs of the PMOS P1 becomes higher than the threshold voltage Vtp, and the PMOS P1 is turned on. When the PMOS P1 is turned on, the potential of the node node1, which is the drain voltages of the PMOS P1 and the NMOS N1, becomes the same as the potential of the power supply VDD.

The reset signal RESET has a waveform obtained by inverting the waveform generated in the node node1 by the inverter INV. That is, the reset signal RESET configures a reset pulse that rises from time t0 and falls at time t1. The reset target circuit receives the reset pulse and executes a reset operation. For example, the reset operation is executed when the reset pulse rising from time t0 is supplied, and the reset operation is canceled when the reset pulse falling at time t1 is supplied.

Here, in order for the reset operation by the power-on reset circuit to reliably act on the reset target circuit, it is assumed that the reset target circuit can reliably execute the reset operation by the reset signal supplied from the power-on reset circuit at the rise of the voltage of the power supply VDD. That is, in a period in which a signal (hereinafter, referred to as a "reset execution signal") for executing the reset operation is output from the power-on reset circuit, the voltage <VDD> of the power supply VDD needs to be a voltage at which the reset operation can be reliably performed in the reset target circuit.

In this regard, in the power-on reset circuit 50 according to the comparative example, since a timing when the reset signal is switched only by the threshold voltage Vtp of the PMOS P1, that is, when the output of the power-on reset circuit 50 is switched from the reset execution signal to a signal (hereinafter, referred to as a "reset cancellation signal") for canceling the reset operation is determined (hereinafter, a voltage for determining this timing is referred to as a "cancellation execution voltage"), a voltage <VDD> necessary for the reset target circuit to reliably perform the reset operation to cancel the reset operation (hereinafter, this necessary voltage <VDD> is referred to as a "cancellation specified voltage") becomes high, and when the reset cancellation signal is output, there may be cases in which the reset target circuit has not yet executed a sufficient reset operation.

Furthermore, in manufacturing of the semiconductor device when the power-on reset circuit 50 and the reset target circuit are arranged on the same semiconductor device, it is necessary to consider manufacturing variations, for example, variations in the threshold voltage of the MOS transistor. That is, it is necessary to consider a relationship between a fluctuation in the cancellation execution voltage due to the manufacturing variation and a fluctuation in the cancellation specified voltage of the reset target circuit. In this regard, in the power-on reset circuit 50 according to the comparative example, since a timing when the reset cancellation signal is output is determined only by the threshold voltage Vtp of the PMOS P1, when the threshold voltage Vtn of the NMOS fluctuates (increases) due to manufacturing variation in manufacturing of the semiconductor device and the cancellation specified voltage increases, the cancellation execution voltage may not be able to follow the fluctuation.

SUMMARY

The present disclosure provides a semiconductor device, a power-on reset circuit and a control method of a semiconductor device that may reliably exhibit a power-on reset function.

A first aspect of the present disclosure is a semiconductor device that outputs a reset signal for controlling a reset operation of a reset target circuit connected to a first power supply and a second power supply having a voltage lower than a voltage of the first power supply, the semiconductor device including: a power supply voltage monitoring circuit connected to the first power supply and the second power supply, the power supply voltage monitoring circuit monitors the voltage of the first power supply, wherein the power supply voltage monitoring circuit includes a first transistor having a first conductive type and a second transistor having a second conductive type different from the first conductive type, and wherein the reset signal is switched when the voltage of the first power supply is equal to or greater than a sum of a threshold voltage of the first transistor, and a threshold voltage of the second transistor.

A second aspect of the present disclosure is a power-on reset circuit including: a first transistor having a first conductive type, the first transistor including a first terminal connected to a first power supply and is diode-connected; a second transistor having a second conductive type which is different from the first conductive type, the second transistor including a first terminal connected to a second power supply different from the first power supply, and including a control terminal connected to a control terminal of the first transistor; a third transistor having a second conductive type and receiving a predetermined voltage at a control terminal, the third transistor including a first terminal connected to the second power supply and a second terminal connected to the control terminal of the first transistor; and a fourth transistor including a first terminal connected to the first power supply and a second terminal connected to a second terminal of the second transistor, wherein a reset signal is switched when a voltage of the first power supply is equal to or greater than a sum of a threshold voltage of the first transistor and a threshold voltage of the second transistor.

A third aspect of the present disclosure is a control method of a semiconductor device that outputs a reset signal for controlling a reset operation of a reset target circuit connected to a first power supply and a second power supply having a voltage lower than a voltage of the first power supply, the semiconductor device including a power supply voltage monitoring circuit connected to the first power supply and the second power supply, to monitor the voltage of the first power supply, the method including: switching the reset signal when the voltage of the first power supply is equal to or greater than a sum of a threshold voltage of a first transistor having a first conductive type included in the power supply voltage monitoring circuit and a threshold voltage of a second transistor included in the power supply voltage monitoring circuit and having a second conductive type different from the first conductive type.

In accordance with the above aspects, a semiconductor device, a power-on reset circuit and a control method of a semiconductor device of the present disclosure may reliably exhibit the power-on reset function.

BRIEF DESCRIPTION OF THE DRAWINGS

Exemplary embodiments will be described in detail based on the following figures, wherein:

FIG. 6 illustrates a time chart of an operation of the power-on reset circuit according to a comparative example.

DETAILED DESCRIPTION

Hereinafter, a semiconductor device, a power-on reset circuit, and a control method of a semiconductor device according to the present disclosure will be described in detail with reference to the drawings. In the following description, a mode in which a semiconductor device 10 according to the present embodiment is applied to the power-on reset circuit will be described as an example.

First Embodiment

Figure 1:
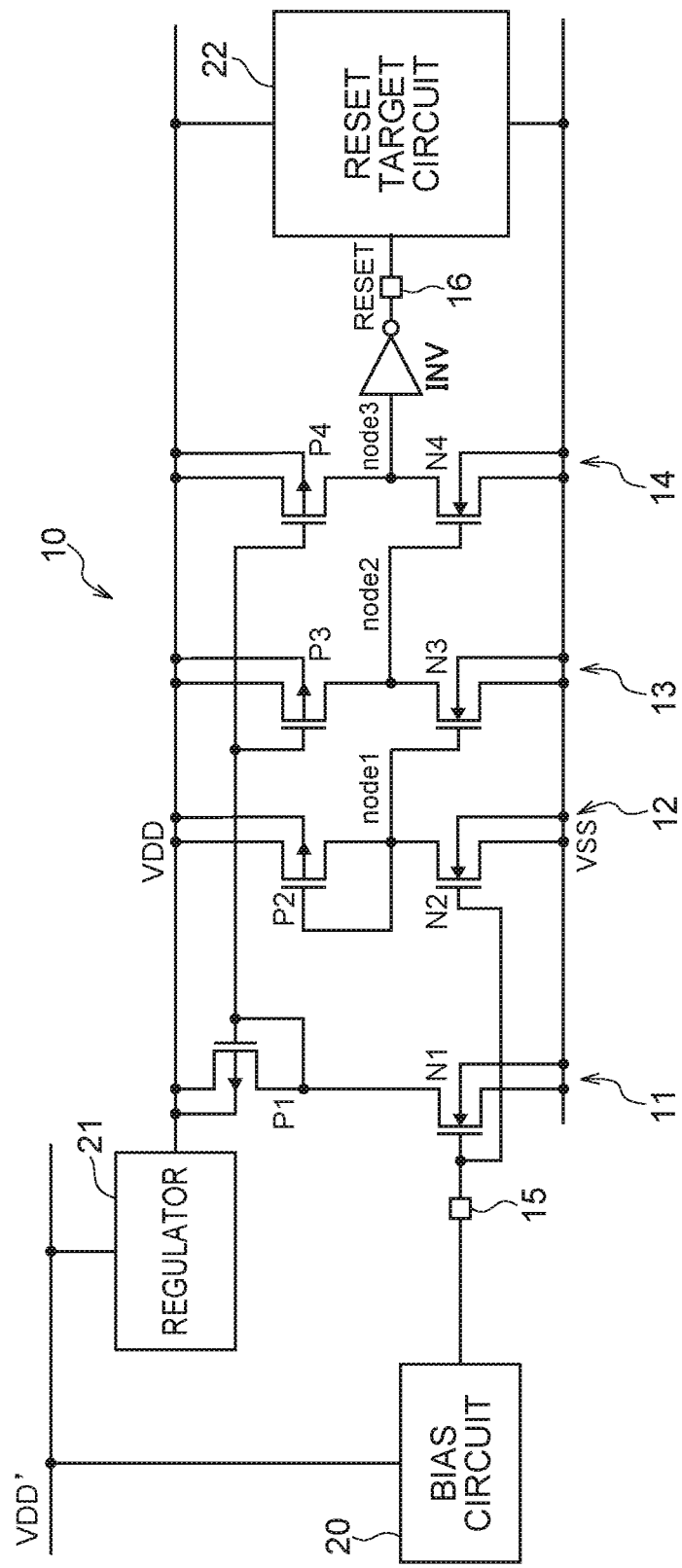
FIG. 1 is a circuit diagram illustrating a semiconductor device according to a first embodiment.
Figure 2:
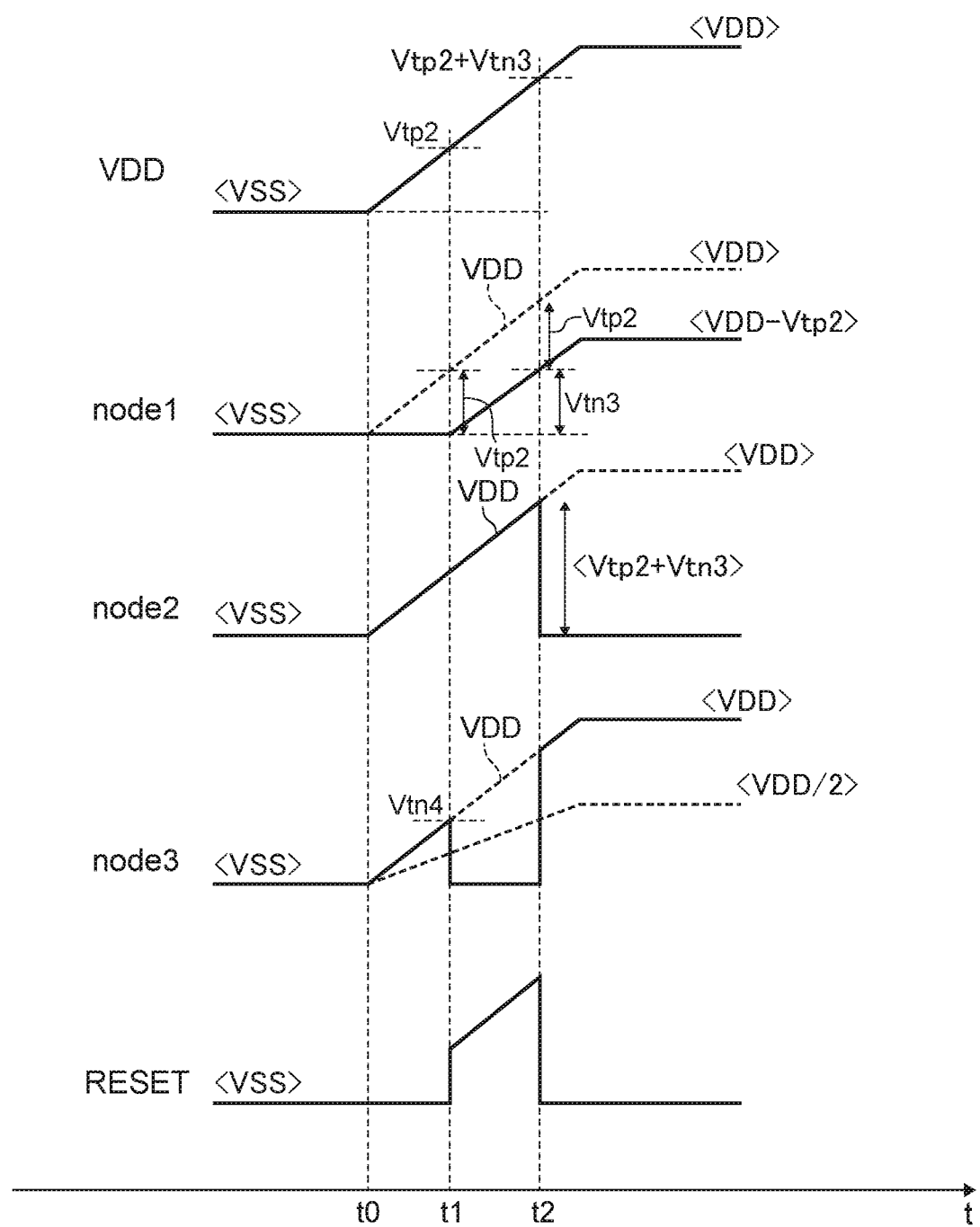
FIG. 2 illustrates a time chart of an operation of the semiconductor device according to the first embodiment.

The semiconductor device 10 according to the present embodiment will be described with reference to FIGS. 1 and 2. FIG. 1 is a circuit diagram illustrating a circuit of the semiconductor device 10 together with peripheral circuits. As illustrated in FIG. 1, the semiconductor device 10 includes a bias mirror circuit 11, a first power supply voltage monitoring circuit 12, a second power supply voltage monitoring circuit 13, and an output circuit 14. The bias mirror circuit 11, the first power supply voltage monitoring circuit 12, the second power supply voltage monitoring circuit 13, and the output circuit 14 configure the power-on reset circuit. The semiconductor device 10 is connected between a power supply VDD having a predetermined power supply voltage and a power supply VSS having a power supply voltage lower than the power supply VDD. FIG. 1 illustrates a bias circuit 20, a regulator 21, and a reset target circuit 22 as the peripheral circuits. The bias circuit 20 is connected to a power supply VDD' having a higher power supply voltage than the power supply VDD, and supplies a bias voltage to the semiconductor device 10 with a bias terminal 15 interposed therebetween. The regulator 21 generates a stabilized voltage <VDD> of the power supply VDD from a voltage <VDD'> of the power supply VDD'. The reset target circuit 22 is a circuit that is connected to the power supply VDD and is a target of a reset operation by a reset signal RESET output from the power-on reset circuit. The reset target circuit 22 may be included in the semiconductor device 10. The "first power supply voltage monitoring circuit 12" is an example of a "first power supply voltage monitoring circuit" according to the present disclosure, the "second power supply voltage monitoring circuit 13" is an example of a "second power supply voltage monitoring circuit" according to the present disclosure, and a combination of the "first power supply voltage monitoring circuit 12" and the "second power supply voltage monitoring circuit 13" is an example of a "power supply voltage monitoring circuit" according to the present disclosure.

The bias mirror circuit 11 includes a PMOS P1 and an NMOS N1. A gate of the NMOS N1 is connected to the bias circuit 20 with the bias terminal 15 interposed therebetween, the source is connected to the power supply VSS, and the drain is connected to the drain of the PMOS P1. The NMOS N1 generates a constant current by mirroring the current by the bias voltage supplied from the bias circuit 20 with the bias terminal 15 interposed therebetween. Here, mirroring refers to, for example, causing a current having a current amount corresponding to a current amount of a current generated in a circuit or an element that supplies a current or a voltage to flow in a circuit or an element thereof such that the NMOS N1 causes a current having a current amount corresponding to the current amount generated in the bias circuit 20 to flow. The PMOS P1 transmits the current flowing through the NMOS N1 to a PMOS P3 and a PMOS P4 at a subsequent stage. The "bias mirror circuit 11" is an example of a "current mirror circuit" according to the present disclosure.

The first power supply voltage monitoring circuit 12 includes an NMOS N2 and a PMOS P2. A gate of the NMOS N2 is connected to a bias terminal 15, a source is connected to the power supply VSS, and a drain is connected to a node node1. The NMOS N2 generates a constant current by mirroring the current by the bias voltage supplied from the bias circuit 20. A source of the PMOS P2 is connected to the power supply VDD, and a gate and a drain are connected to the node node1. That is, the PMOS P2 is diode-connected. The first power supply voltage monitoring circuit 12 is a circuit that monitors the voltage of the power supply VDD. Here, monitoring the voltage of the power supply VDD means operating in accordance with a rise of the voltage of the power supply VDD.

The second power supply voltage monitoring circuit 13 includes an NMOS N3 and a PMOS P3. A gate of the NMOS N3 is connected to the node node1, a source is connected to the power supply VSS, and a drain is connected to a node node2. A gate of the PMOS P3 is connected to the gate of the PMOS P1, a source is connected to the power supply VDD, and a drain is connected to the node node2. The PMOS P3 mirrors the current flowing through the NMOS N1 with the PMOS P1 interposed therebetween to generate a constant current. The second power supply voltage monitoring circuit 13 is a circuit that monitors the voltage of the power supply VDD. Here, monitoring the voltage of the power supply VDD means operating in accordance with a rise of the voltage of the power supply VDD.

The output circuit 14 includes an NMOS N4, a PMOS P4, and an inverter INV. A gate of the NMOS N4 is connected to the node node2, a source is connected to the power supply VSS, and a drain is connected to a node node3. A gate of the PMOS P4 is connected to the gate of the PMOS P1, a source is connected to the power supply VDD, and a drain is connected to the node node3. The PMOS P4 mirrors the current flowing through the NMOS N1 with the PMOS P1 interposed therebetween to generate a constant current.

An input of the inverter INV is connected to the node node3, and an output is connected to an output terminal 16. The output terminal 16 is connected to the reset target circuit 22. The inverter INV forms a waveform of a voltage generated in the node node3 and functions as an output buffer when the reset signal RESET is output to the output terminal 16.

Here, in the semiconductor device 10 according to the present embodiment, the NMOS N4, the PMOS P4, and the inverter INV are provided for waveform forming and the output buffer. Accordingly, the configuration is not essential, and can be omitted as long as the waveform or the like are decent.

Next, an operation of the semiconductor device 10 will be described with reference to FIG. 2. FIG. 2 is a diagram illustrating a time chart according to the operation of the semiconductor device 10. In FIG. 2, changes in waveforms of the power supply VDD, the node node1, the node node2, the node node3, and the reset signal RESET when the power supply VDD is turned on are illustrated along the passage of time t.

Here, a time when the voltage is applied to the power supply VDD of the semiconductor device 10 is defined as time t0. In a procedure in which the voltage <VDD> of the power supply VDD increases from time t0, while the voltage <VDD> is less than a threshold voltage Vtp2 of the PMOS P2, a gate voltage Vgs of the PMOS P2 is still low, and the PMOS P2 is turned off. At this time, since the NMOS N2 is turned on, a potential of the node node1 is identical to a potential of the power supply VSS. At time t1 when the voltage <VDD> reaches the threshold voltage Vtp2 of the PMOS P2, the gate voltage Vgs of the PMOS P2 becomes higher than the threshold voltage Vtp2 of the PMOS P2, and the PMOS P2 is turned on. As a result, when the time reaches time t1, the potential of the node node1 becomes <VDD−Vtp2>.

In a procedure in which the voltage <VDD> of the power supply VDD increases from time t0, the NMOS N3 is turned off until the power supply VDD gives a gate voltage Vgs sufficient to turn on the NMOS N3. During this time, since the PMOS P3 is turned on, a potential of the node node2 is a potential of the power supply VDD. At time t1, since the voltage <VDD> of the power supply VDD is higher than the threshold voltage Vtp2 of the PMOS P2 but the potential of the node node1 is <VDD−Vtp2>, the NMOS N3 remains off. When the voltage <VDD> further increases and a threshold voltage of the NMOS N3 is Vtn3, a gate voltage Vgs of the NMOS N3 becomes higher than the threshold voltage Vtn3 of the NMOS N3 at time t2 when the voltage <VDD> reaches (Vtp2+Vtn3), and the NMOS N3 is turned on. Accordingly, when the time reaches time t2, the potential of the node node2 becomes identical to the potential of the power supply VSS. As a result, a pulsed waveform as illustrated in FIG. 2 is generated in the node node2.

In a procedure in which the voltage <VDD> of the power supply VDD increases from time t0, a gate voltage Vgs of the NMOS N4 is still low and the NMOS N4 is turned off and the PMOS P4 is turned on until time t1. Thus, a potential of the node node3 is identical to the potential of the power supply VDD. When the gate voltage Vgs of the NMOS N4 becomes higher than a threshold voltage Vtn4 and the NMOS N4 is turned on at a point in time when the voltage <VDD> reaches the threshold voltage Vtn4 of the NMOS N4, the potential of the node node3 becomes identical to the potential of the power supply VSS. At time t2 when the voltage <VDD> reaches (Vtp2+Vtn3), since the NMOS N4 is turned on, the node node3 is disconnected from the power supply VSS, and the potential of the node node3 becomes identical to the potential of the power supply VDD. Here, for ease of understanding, the threshold voltages of the PMOSs P1 to P4 and the threshold voltages of the NMOSs N1 to N4 are equal to each other.

The reset signal RESET has a waveform obtained by inverting the waveform generated in the node node3 by the inverter INV. By a threshold of the inverter INV, the reset signal RESET configures a reset pulse that rises from time t1 and falls at time t2. The reset target circuit 22 receives the reset pulse and executes a reset operation. That is, the reset signal RESET is a reset execution signal that causes the reset operation of the reset target circuit 22 to be executed in a period from time t1 to time t2, and is a reset cancellation signal that causes the reset operation of the reset target circuit 22 to be canceled after time t2. That is, the reset signal RESET is a reset execution signal when the voltage <VDD> of the power supply VDD is less than the sum of the threshold voltage Vtp2 of the PMOS P2 and the threshold voltage Vtn3 of the NMOS N3, and is a reset cancellation signal when the voltage <VDD> of the power supply VDD is equal to or greater than the sum of the threshold voltage Vtp2 of the PMOS P2 and the threshold voltage Vtn3 of the NMOS N3.

Here, as described above, in order for the reset target circuit to reliably execute the reset operation by the power-on reset circuit, the voltage <VDD> of the power supply VDD needs to be a voltage at which the reset operation can be reliably performed in the reset target circuit in a period in which the reset execution signal is output. In this regard, in the semiconductor device 10 according to the present embodiment, the reset signal is switched not at time t1 when the voltage <VDD> reaches the threshold voltage Vtp2 of the PMOS P2 but at time t2 when the increase in the voltage <VDD> further reaches the threshold voltage Vtn3 of the NMOS N3 from time t1, that is, the reset execution signal is switched to the reset cancellation signal. That is, in the semiconductor device 10, a cancellation execution voltage is determined not only by the threshold voltage Vtp2 of the PMOS P2 but also by (Vtp2+Vtn3) that is the sum of the threshold voltage Vtp2 of the PMOS P2 and the threshold voltage Vtn3 of the NMOS N3. Thus, the cancellation execution voltage of the semiconductor device 10 according to the present embodiment can be set to be higher than a cancellation execution voltage of the power-on reset circuit 50 according to a comparative example, and when the reset cancellation signal is output, it is possible to prevent the reset target circuit 22 from not yet executing a sufficient reset operation.

As described above, in accordance with the semiconductor device 10 according to the present embodiment, the reset signal is switched, that is, the reset execution signal is switched to the reset cancellation signal at a point in time when the voltage of the power supply VDD becomes (Vptp2+Vtn3), that is, at a point in time when the voltage becomes (threshold voltage of NMOS+threshold voltage of PMOS). In a semiconductor device 50, the reset cancellation signal is output when the voltage of the power supply VDD reaches the threshold voltage of the PMOS P1. Meanwhile, in the semiconductor device 10, the voltage <VDD> of the power supply VDD at the time of power-on reset, that is, the cancellation execution voltage can be raised to a voltage at which the reset operation can be executed more reliably in the reset target circuit 22. As a result, in accordance with the semiconductor device 10 according to the present embodiment, it is possible to provide a semiconductor device that realizes a power-on reset circuit that more reliably exhibits a function, and a control method of a semiconductor device.

When the power-on reset circuit and the reset target circuit are mounted in the same semiconductor device, the semiconductor device 10 according to the present embodiment can obtain the following effects. That is, as described above, in accordance with the semiconductor device 10 of the present embodiment, a timing, when a signal for canceling the reset operation is output, is determined not only by the threshold voltage Vtp of the PMOS but also by the threshold voltage Vtp of the PMOS and the threshold voltage Vtn of the NMOS. Even when, for example, the threshold voltage Vtn of the NMOS fluctuates due to manufacturing variation in manufacturing of the semiconductor device and a cancellation specified voltage of the reset target circuit becomes high, since the cancellation execution voltage of the semiconductor device 10 according to the present embodiment also includes the threshold voltage Vtn of the NMOS, it is possible to follow the fluctuation of the cancellation specified voltage of the reset target circuit. As a result, the semiconductor device 10, a power-on reset circuit and a control method of a semiconductor device of the present embodiment may more reliably exhibit the power-on reset function.

Second Embodiment

Figure 3:
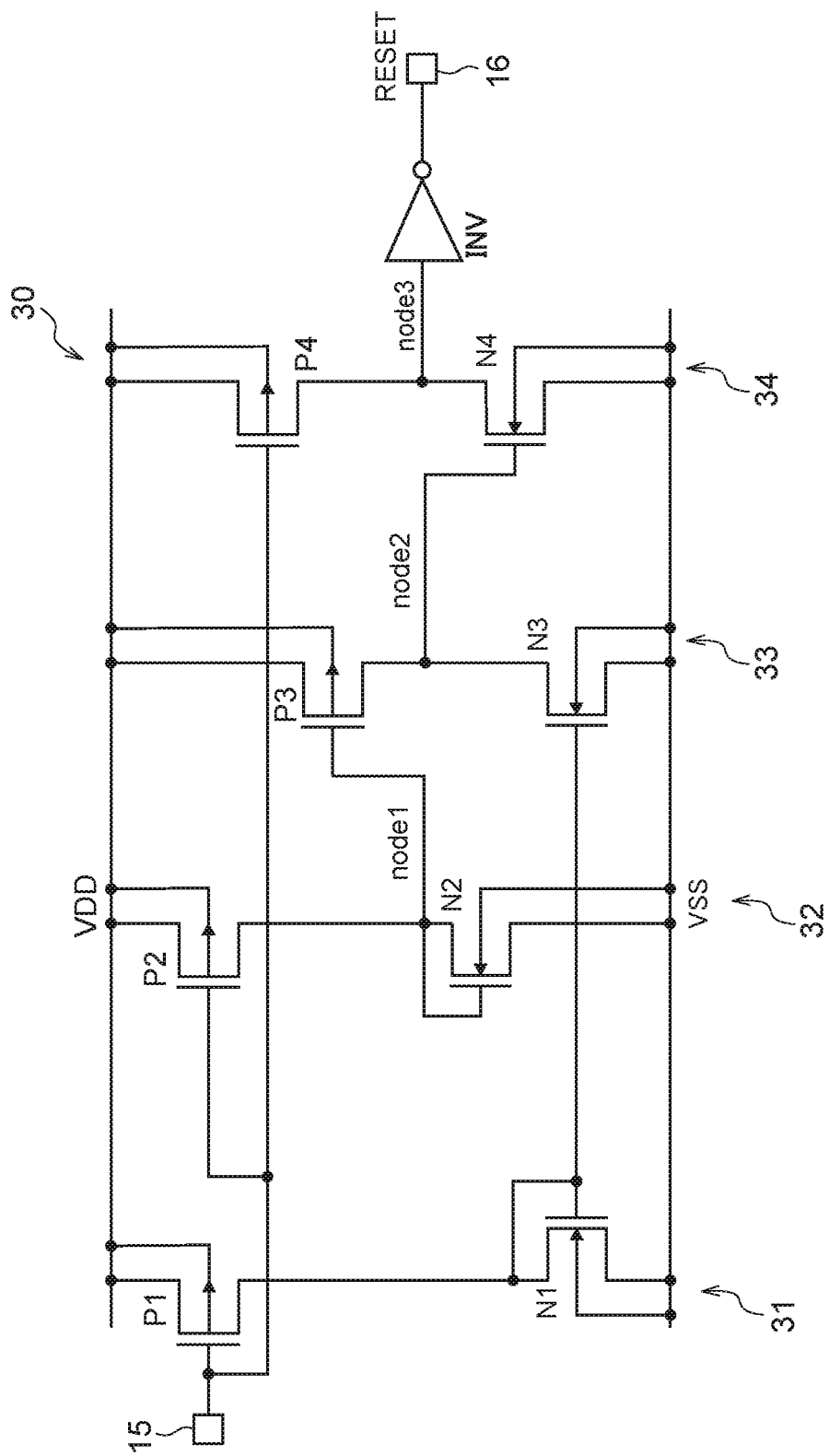
FIG. 3 is a circuit diagram illustrating a semiconductor device according to a second embodiment.
Figure 4:
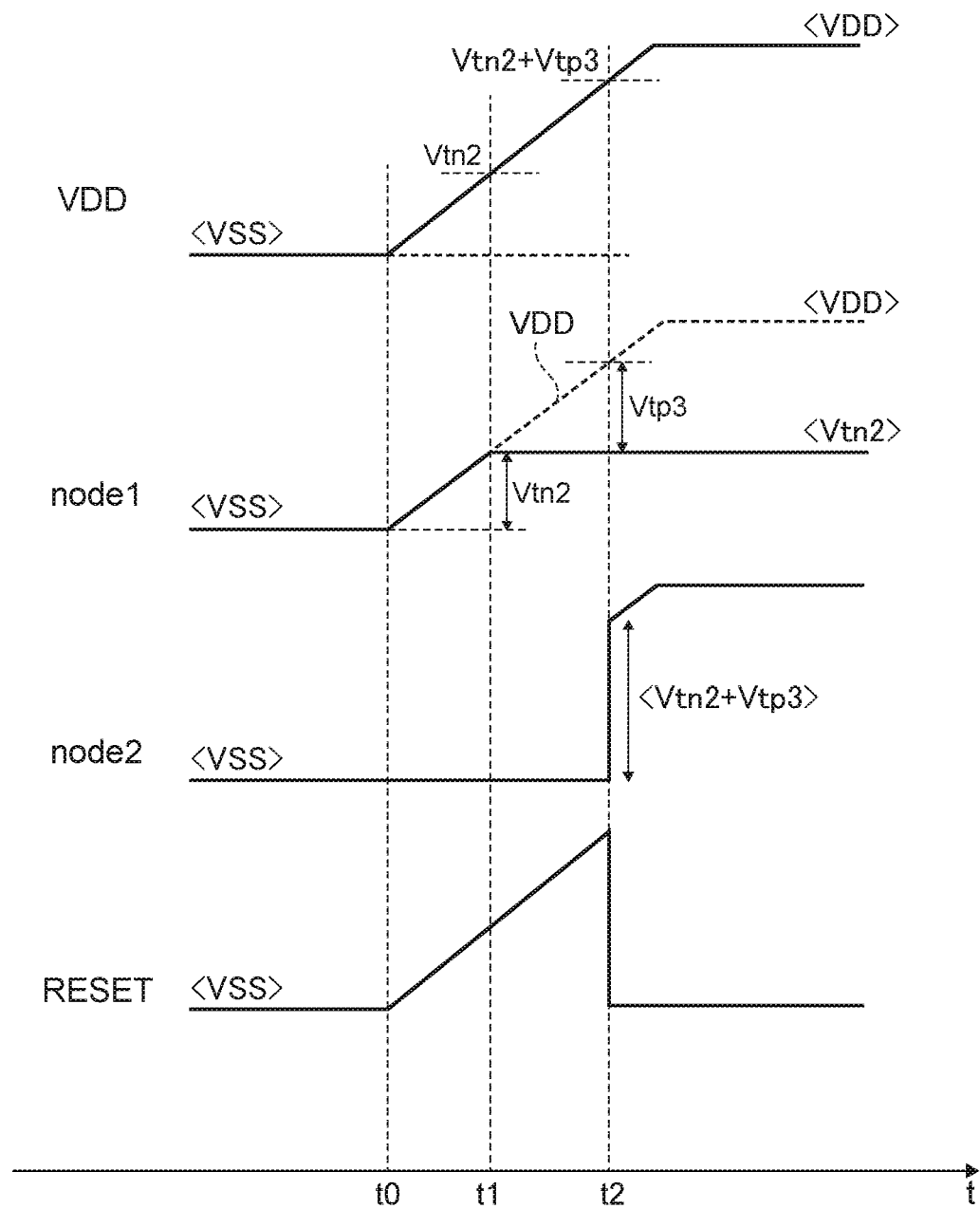
FIG. 4 illustrates a time chart of an operation of the semiconductor device according to the second embodiment.
Figure 5:
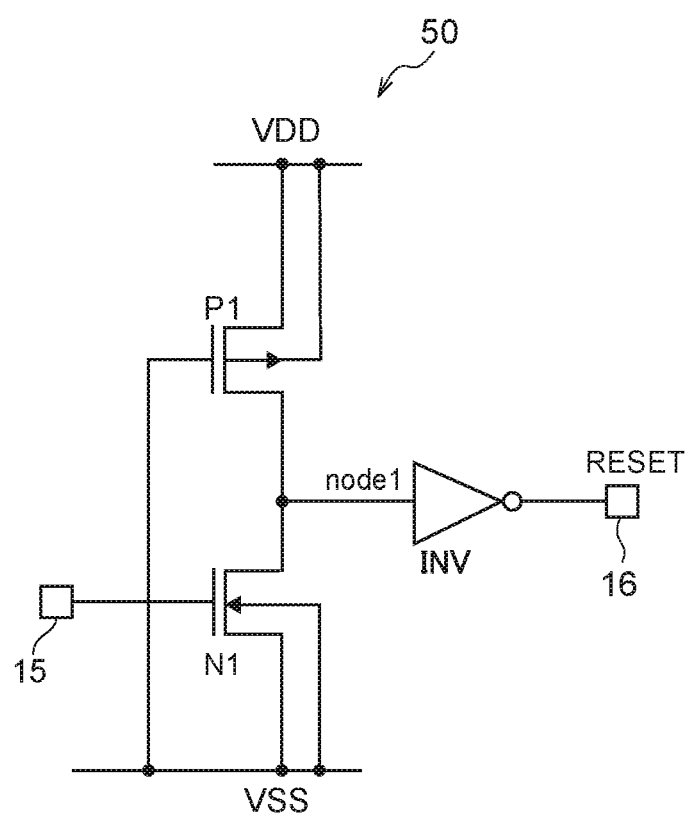
FIG. 5 is a circuit diagram illustrating a power-on reset circuit according to a comparative example.

A semiconductor device 30 according to the present embodiment will be described with reference to FIGS. 3 and 4. FIG. 3 is a circuit diagram illustrating a circuit of the semiconductor device 30 together with peripheral circuits. As illustrated in FIG. 3, the semiconductor device 30 includes a bias mirror circuit 31, a first power supply voltage monitoring circuit 32, a second power supply voltage monitoring circuit 33, and an output circuit 34. The bias mirror circuit 31, the first power supply voltage monitoring circuit 32, the second power supply voltage monitoring circuit 33, and the output circuit 34 configure a power-on reset circuit. The semiconductor device 30 is connected between a power supply VDD having a predetermined power supply voltage and a power supply VSS having a power supply voltage lower than the power supply VDD. Similarly to the semiconductor device 10 according to the first embodiment, the semiconductor device 30 according to the present embodiment also includes a bias circuit 20, a regulator 21, and a reset target circuit 22 as the peripheral circuits, but the illustration and description thereof are omitted in FIG. 3. As in the first embodiment, the "first power supply voltage monitoring circuit 32" is an example of a "first power supply voltage monitoring circuit" according to the present disclosure, the "second power supply voltage monitoring circuit 33" is an example of a "second power supply voltage monitoring circuit" according to the present disclosure, and a combination of the "first power supply voltage monitoring circuit 32" and the "second power supply voltage monitoring circuit 33" is an example of a "power supply voltage monitoring circuit" according to the present disclosure.

The bias mirror circuit 31 includes a PMOS P1 and an NMOS N1. A gate of the PMOS P1 is connected to a bias circuit 20 (not illustrated) with a bias terminal 15 interposed therebetween, a source thereof is connected to the power supply VDD, and a drain thereof is connected to a drain of the NMOS N1. The PMOS P1 mirrors a current by a bias voltage supplied from the bias circuit 20 (not illustrated) with the bias terminal 15 interposed therebetween to generate a constant current. Here, mirroring refers to, for example, causing a current having a current amount corresponding to a current amount of a current generated in a circuit or an element that supplies a current or a voltage to flow in a circuit or an element thereof, such that the PMOS P1 causes a current having a current amount corresponding to the current amount generated in the bias circuit 20, to flow. The NMOS N1 transmits the current flowing through the PMOS P1 to an NMOS N3 at a subsequent stage. The "bias mirror circuit 31" is an example of a "current mirror circuit" according to the present disclosure.

The first power supply voltage monitoring circuit 32 includes an NMOS N2 and a PMOS P2. A gate of the PMOS P2 is connected to the gate of the PMOS P1, a source is connected to the power supply VDD, and a drain is connected to a node node1. The PMOS P2 mirrors the current flowing through the PMOS P1 to generate a constant current. A source of the NMOS N2 is connected to the power supply VSS, and a gate and a drain are connected to the node node1. That is, the NMOS N2 is diode-connected. The first power supply voltage monitoring circuit 32 is a circuit that monitors a voltage of the power supply VDD. Here, monitoring the voltage of the power supply VDD means operating in accordance with a rise of the voltage of the power supply VDD.

The second power supply voltage monitoring circuit 33 includes an NMOS N3 and a PMOS P3. A gate of the PMOS P3 is connected to the node node1, a source is connected to the power supply VDD, and a drain is connected to a node node2. A gate of the NMOS N3 is connected to a gate of the NMOS N1, a source is connected to the power supply VSS, and a drain is connected to the node node2. The NMOS N3 mirrors the current flowing through the NMOS N1 to generate a constant current. The second power supply voltage monitoring circuit 33 is a circuit that monitors the voltage of the power supply VDD. Here, monitoring the voltage of the power supply VDD means operating in accordance with a rise of the voltage of the power supply VDD.

The output circuit 14 includes an NMOS N4, a PMOS P4, and a buffer BUFF. A gate of the NMOS N4 is connected to the node node2, a source is connected to the power supply VSS, and a drain is connected to a node node3. A gate of the PMOS P4 is connected to the gate of the PMOS P1, a source is connected to the power supply VDD, and a drain is connected to the node node3. The PMOS P4 mirrors the current flowing through the PMOS P1 to generate a constant current.

An input of the buffer BUFF is connected to a node node3, and an output is connected to an output terminal 16. The output terminal 16 is connected to the reset target circuit 22 (not illustrated). The buffer BUFF forms a waveform of a voltage generated in the node node3 and functions as an output buffer when a reset signal RESET is output to the output terminal 16.

Here, similarly to the semiconductor device 10, in the semiconductor device 30 according to the present embodiment, the NMOS N4, the PMOS P4, and the buffer BUFF are provided for waveform forming and the output buffer. Accordingly, the configuration is not essential, and may be omitted as long as the waveform or the like are decent.

Next, an operation of the semiconductor device 30 will be described with reference to FIG. 4. FIG. 4 is a diagram illustrating a time chart according to the operation of the semiconductor device 30. In FIG. 4, changes in the waveforms of the power supply VDD, the node node1, the node node2, the node node3, and the reset signal RESET when the power supply VDD is turned on are illustrated along the passage of time t.

A time when the voltage is applied to the power supply VDD of the semiconductor device 30 is defined as time t0. In a procedure in which the voltage <VDD> of the power supply VDD increases from time t0, while the voltage <VDD> is less than a threshold voltage Vtn2 of the NMOS N2, a gate voltage Vgs of the NMOS N2 is still low, and the NMOS N2 is turned off. At this time, since the PMOS P2 is turned on, a potential of the node node1 is identical to a potential of the power supply VDD. At time t1 when the voltage <VDD> reaches the threshold voltage Vtn2 of the NMOS N2, the gate voltage Vgs of the NMOS N2 becomes higher than the threshold voltage Vtn2 of the NMOS N2, and the NMOS N2 is turned on. As a result, when the time reaches time t1, the potential of the node node1 becomes <Vtn2>. Since the NMOS N2 is diode-connected, the potential of the node node1 becomes constant at <Vtn2> after time t1.

In a procedure in which the voltage <VDD> of the power supply VDD increases from time t0, the PMOS P3 is turned off until the power supply VDD gives a gate voltage Vgs sufficient to turn on the PMOS P3. During this time, since the NMOS N3 is turned on, a potential of the node node2 is the potential of the power supply VSS. When the voltage <VDD> further increases and a threshold voltage of the PMOS P3 is Vtp3, a gate voltage Vgs of the PMOS P3 becomes higher than the threshold voltage Vtp3 of the PMOS P3 at time t2 when the voltage <VDD> reaches (Vtn2+Vtp3), and the PMOS P3 is turned on. Accordingly, when the time reaches time t2, the potential of the node node2 becomes identical to the potential of the power supply VDD. As a result, a stepwise waveform illustrated in FIG. 4 is generated in the node node2.

In a procedure in which the voltage <VDD> of the power supply VDD increases from time t0, a gate voltage Vgs of the NMOS N4 is still low and the NMOS N4 is turned off and the PMOS P4 is turned on until time t2. Thus, a potential of the node node3 is identical to the potential of the power supply VDD. The voltage <VDD> further increases, the PMOS P3 is turned on, and the NMOS N4 is turned on at time t2 when the potential of the node node2 becomes identical to the potential of the power supply VDD. As a result, the potential of the node node3 becomes identical to the potential of the power supply VSS. Here, for ease of understanding, the threshold voltages of the PMOSs P1 to P4 and the threshold voltages of the NMOSs N1 to N4 are equal to each other.

The reset signal RESET configures a reset pulse that rises from time t0 and is canceled at time t2. The reset target circuit 22 (not illustrated) receives the reset pulse and performs a reset operation. Note that the reset signal RESET is a reset execution signal that causes the reset operation of the reset target circuit 22 to be executed in a period from time t0 to time t2, and is a reset cancellation signal that causes the reset operation of the reset target circuit 22 to be canceled after time t2. That is, the reset signal RESET is a reset execution signal when the voltage <VDD> of the power supply VDD is less than the sum of the threshold voltage Vtn2 of the NMOS N2 and the threshold voltage Vtp3 of the PMOS P3, and is a reset cancellation signal when the voltage <VDD> of the power supply VDD is equal to or greater than the sum of the threshold voltage Vtn2 of the NMOS N2 and the threshold voltage Vtp3 of the PMOS P3.

Here, as described above, in order for the reset target circuit to reliably execute the reset operation by the power-on reset circuit, the voltage <VDD> of the power supply VDD needs to be a voltage at which the reset operation can be reliably performed in the reset target circuit in a period in which the reset execution signal is output. In this regard, in the semiconductor device 30 according to the present embodiment, the reset signal is switched not at time t1 when the voltage <VDD> reaches the threshold voltage Vtn2 of the NMOS N2 but at time t2 when the voltage <VDD> reaches the threshold voltage Vtp3 of the PMOS P3 in addition to Vtn2, that is, the reset execution signal is switched to the reset cancellation signal. That is, in the semiconductor device 30, a cancellation execution voltage is determined not only by the threshold voltage Vtn2 of the NMOS N2 but also by (Vtn2+Vtp3) that is the sum of the threshold voltage Vtn2 of the NMOS N2 and the threshold voltage Vtp3 of the PMOS P3. Thus, the cancellation execution voltage of the semiconductor device 30 according to the present embodiment can be made higher than the cancellation execution voltage of the power-on reset circuit 50 according to the comparative example, and when the reset cancellation signal is output, it is possible to prevent the reset target circuit 22 from not yet executing a sufficient reset operation.

As described above, in accordance with the semiconductor device 30 according to the present embodiment, the reset execution signal is switched to the reset cancellation signal at a point in time when the voltage of the power supply VDD becomes (Vptn2+Vtp3), that is, at a point in time when the voltage becomes (threshold voltage of NMOS+threshold voltage of PMOS). In the semiconductor device 50, the reset cancellation signal is output when the voltage of the power supply VDD reaches the threshold voltage of the PMOS P1, Meanwhile, in the semiconductor device 30, the voltage <VDD> of the power supply VDD at the time of power-on reset, that is, the cancellation execution voltage can be raised to a voltage at which the reset operation can be executed more reliably in the reset target circuit 22. As a result, in accordance with the semiconductor device 30 according to the present embodiment, it is possible to provide a semiconductor device that realizes a power-on reset circuit that more reliably exhibits a function, and a control method of a semiconductor device.

When the power-on reset circuit and the reset target circuit 22 are mounted in the same semiconductor device, the semiconductor device 30 according to the present embodiment can obtain the following effects. In accordance with the semiconductor device 30 according to the present embodiment, a timing when a signal for canceling the reset operation is output is determined not only by the threshold voltage Vtn of the NMOS but also by the threshold voltage Vtn of the NMOS and the threshold voltage Vtp of the PMOS. Even when, for example, the threshold voltage Vtp of the PMOS fluctuates due to manufacturing variation in manufacturing of the semiconductor device and a cancellation specified voltage of the reset target circuit becomes high, since the cancellation execution voltage of the semiconductor device 30 according to the present embodiment also includes the threshold voltage Vtp of the PMOS, it is possible to follow the fluctuation of the cancellation specified voltage of the reset target circuit. As a result, the semiconductor device 30, a power-on reset circuit, and a control method of a semiconductor device according to the present embodiment, may more reliably exhibit the power-on reset function.

In each of the embodiments, although the operation at the time of power-on has been described, the semiconductor device according to each of the above embodiments can perform the reset operation even at the time of power-off. Accordingly, even when an instantaneous interruption occurs in the power supply VDD, it is possible to temporarily reset the reset target circuit.

What is claimed is:

1. A semiconductor device that outputs a reset signal for controlling a reset operation of a reset target circuit connected to a first power supply and a second power supply having a voltage lower than a voltage of the first power supply, the semiconductor device comprising:
   a power supply voltage monitoring circuit connected to the first power supply and the second power supply, the power supply voltage monitoring circuit monitors the voltage of the first power supply; and
   a current mirror circuit to which a predetermined voltage is supplied to cause a first current to flow, wherein the current mirror circuit transmits a second current based on the first current to another transistor,
   wherein the power supply voltage monitoring circuit includes a first transistor having a first conductive type and a second transistor having a second conductive type different from the first conductive type,
   wherein the reset signal is switched when the voltage of the first power supply is equal to or greater than a sum of a threshold voltage of the first transistor, and a threshold voltage of the second transistor,
   wherein the power supply voltage monitoring circuit includes a first power supply voltage monitoring circuit including the first transistor and a second power supply voltage monitoring circuit including the second transistor,
   wherein the first transistor is diode-connected,
   wherein a control terminal of the second transistor is connected to a control terminal of the first transistor,
   wherein the first power supply voltage monitoring circuit includes a third transistor connected to the control terminal of the first transistor, the first power supply voltage monitoring circuit receives the second current from the current mirror circuit and causes a third current to flow to the first transistor, and
   wherein the second power supply voltage monitoring circuit includes a fourth transistor connected to a first terminal of the second transistor, the second power supply voltage monitoring circuit receives the second current from the current mirror circuit and causes a fourth current to flow to the second transistor.

2. The semiconductor device according to claim 1, further comprising:
   a fifth transistor including a control terminal connected to a connection point between the second transistor and the fourth transistor, and
   a sixth transistor connected to the fifth transistor, the sixth transistor receiving the second current from the current mirror circuit and causing a fifth current to flow to the fifth transistor.

3. The semiconductor device according to claim 2, further comprising an inverter including an input connected to a connection point between the fifth transistor and the sixth transistor, the inverter outputting a signal in which an input signal is inverted.

4. The semiconductor device according to claim 2, further comprising a reset target circuit connected to the first power supply and the second power supply, the reset target circuit receives the reset signal.

5. The semiconductor device according to claim 1, wherein:
the reset signal includes a reset execution signal and a reset cancellation signal,
the reset execution signal is output when the voltage of the first power supply is less than the sum of the threshold voltage of the first transistor and the threshold voltage of the second transistor, and
the reset cancellation signal is output when the voltage of the first power supply is equal to or greater than the sum of the threshold voltage of the first transistor and the threshold voltage of the second transistor, and
the reset signal is switched to the reset cancellation signal from the reset execution signal when the voltage of the first power supply is equal to or greater than the sum of the threshold voltage of the first transistor and the threshold voltage of the second transistor.

6. A power-on reset circuit comprising:
a first transistor having a first conductive type, the first transistor including a first terminal connected to a first power supply and is diode-connected;
a second transistor having a second conductive type which is different from the first conductive type, the second transistor including a first terminal connected to a second power supply different from the first power supply, and including a control terminal connected to a control terminal of the first transistor;
a third transistor having the second conductive type and receiving a predetermined voltage at a control terminal, the third transistor including a first terminal connected to the second power supply and a second terminal connected to the control terminal of the first transistor;
a fourth transistor including a first terminal connected to the first power supply and a second terminal connected to a second terminal of the second transistor and
a current mirror circuit to which the predetermined voltage is supplied to cause a first current to flow, wherein the current mirror circuit transmits a second current based on the first current to another transistor,
wherein a reset signal is switched when a voltage of the first power supply is equal to or greater than a sum of a threshold voltage of the first transistor and a threshold voltage of the second transistor,
wherein the power supply voltage monitoring circuit includes a first power supply voltage monitoring circuit including the first and third transistors, and a second power supply voltage monitoring circuit including the second and fourth transistors,
wherein the first power supply voltage monitoring circuit receives the second current from the current mirror circuit and causes a third current to flow to the first transistor, and
wherein the second power supply voltage monitoring circuit receives the second current from the current mirror circuit and causes a fourth current to flow to the second transistor.

* * * * *